US008779473B2

(12) United States Patent
Liu et al.

(10) Patent No.: US 8,779,473 B2
(45) Date of Patent: Jul. 15, 2014

(54) SIGE HBT DEVICE AND MANUFACTURING METHOD OF THE SAME

(71) Applicant: Shanghai Hua Hong Nec Electronics Co., Ltd., Shanghai (CN)

(72) Inventors: Donghua Liu, Shanghai (CN); Jing Shi, Shanghai (CN); Wenting Duan, Shanghai (CN); Wensheng Qian, Shanghai (CN); Jun Hu, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/888,596

(22) Filed: May 7, 2013

(65) Prior Publication Data

US 2013/0299879 A1    Nov. 14, 2013

(30) Foreign Application Priority Data

May 8, 2012 (CN) .......................... 2012 1 0139894

(51) Int. Cl.
*H01L 29/66* (2006.01)

(52) U.S. Cl.
USPC ........... 257/197; 257/273; 257/474; 257/477; 257/517; 257/565; 257/E31.069; 257/E29.033

(58) Field of Classification Search
USPC ................. 257/197, 273, 474, 477, 517, 565, 257/E31.069, E29.033
See application file for complete search history.

(56) References Cited

U.S. PATENT DOCUMENTS

| 2008/0164494 A1* | 7/2008 | Pagette et al. ................. 257/197 |
| 2012/0032233 A1* | 2/2012 | Qian ............................. 257/197 |
| 2012/0235143 A1* | 9/2012 | Cai et al. ......................... 257/51 |

* cited by examiner

*Primary Examiner* — Timor Karimy
(74) *Attorney, Agent, or Firm* — MKG, LLC

(57) ABSTRACT

A silicon-germanium (SiGe) heterojunction bipolar transistor (HBT) device that includes a substrate; a buried oxide layer near a bottom of the substrate; a collector region above and in contact with the buried oxide layer; a field oxide region on each side of the collector region; a pseudo buried layer under each field oxide region and in contact with the collector region; and a through region under and in contact with the buried oxide layer. A method for manufacturing a SiGe HBT device is also disclosed. The SiGe HBT device can isolate noise from the bottom portion of the substrate and hence can improve the intrinsic noise performance of the device at high frequencies.

9 Claims, 6 Drawing Sheets

SIGE HBT DEVICE AND MANUFACTURING METHOD OF THE SAME

CROSS-REFERENCES TO RELATED APPLICATIONS

This application claims the priority of Chinese patent application number 201210139894.3, filed on May 8, 2012, the entire contents of which are incorporated herein by reference.

TECHNICAL FIELD

This disclosure pertains to the field of semiconductor fabrication, and more particularly, to a silicon-germanium (SiGe) heterojunction bipolar transistor (HBT) device. This invention also relates to a method of manufacturing a SiGe HBT device.

BACKGROUND

With the development of modern mobile communication and microwave communication as well as demands for high-performance, low-noise and low-cost radio frequency (RF) components, traditional silicon devices can no longer meet new requirements on technical specifications, output power and linearity. Therefore, SiGe HBT devices have been proposed which play an important role in the applications of high-frequency power amplifiers. Compared with gallium arsenide (GaAs) devices, though SiGe HBT devices are at a disadvantage in frequency performance, they can well solve the issue of heat dissipation accompanying with power amplification, benefiting from their better thermal conductivities and good mechanical capacities of their substrates. Moreover, SiGe HBT devices also have better linearity and higher integration level. Further, SiGe HBT devices are well compatible with the conventional silicon process and still belong to the silicon-based technology and the complementary metal oxide semiconductor (CMOS) process, thus reducing manufacturing cost. For these reasons, the SiGe BiCMOS (bipolar complementary metal oxide semiconductor) process provides great convenience for the integration of power amplifiers and logic control circuits.

Currently, SiGe HBT devices have been widely adopted internationally as components for low-noise amplifier (LNA) circuits employed in front-end amplifier circuits of signal receiving systems, such as global positioning systems. For LNA circuits, the most critical factor is their high-frequency noise figures. Although the noise performance of an LNA circuit is also affected by whether the circuit is properly designed, the most determining factor is the intrinsic noise characteristics of the devices. To improve the intrinsic noise performance of a device in high-frequency applications, it is an important approach to improve its noise isolation property.

SUMMARY OF THE INVENTION

The present invention is directed to the provision of a silicon-germanium (SiGe) heterojunction bipolar transistor (HBT) device with a substrate noise isolation feature. Compared to conventional SiGe HBT devices, it has an improved performance in device intrinsic noise isolation and hence enables an LNA low-noise amplifier (LNA) circuit employing it to achieve better noise performance in high-frequency applications. The present invention is also directed to the provision of a method for manufacturing a SiGe HBT device.

In order to achieve the above objectives, the present invention provides a SiGe HBT device, including: a substrate; a buried oxide layer formed near a bottom of the substrate; a collector region formed in the substrate, the collector region being located above and in contact with the buried oxide layer; a field oxide region formed on each side of the collector region; a pseudo buried layer formed under each field oxide region and in contact with the collector region; and a through region located under and in contact with the buried oxide layer, wherein the buried oxide layer has a width that is greater than a width of the collector region and smaller than a sum of the width of the collector region and widths of the pseudo buried layers.

In specific embodiments, the through region may have a width that is substantially equal to the width of the collector region.

In more specific embodiments, each of the pseudo buried layers may be overlapped with part of the collector region.

In more specific embodiments, the buried oxide layer may have a thickness of 100 Å to 1000Å.

In more specific embodiments, the substrate may be a P-type substrate and the collector region, the pseudo buried layers and the through region can contain a dopant of arsenic or phosphorus as dopant.

In more specific embodiments, the SiGe HBT device may further include: a SiGe epitaxial layer formed above the collector region and the field oxide regions; isolation oxide layers and a polysilicon layer, both formed on the SiGe epitaxial layer; a first isolation sidewall, formed on each side of the SiGe epitaxial layer; a second isolation sidewall, formed on each side of a body composed of the isolation oxide layers and the polysilicon layer; a deep-hole contact, formed in each field oxide region and in contact with the top of the pseudo buried layer for picking up a collector; a first contact-hole electrode connected to the SiGe epitaxial layer for picking up a base; and a second contact-hole electrode formed on the polysilicon layer for picking up an emitter.

The present invention also provides a method for manufacturing SiGe HBT device, including:
forming a buried oxide layer near a bottom of a substrate;
forming a collector region above the buried oxide layer;
forming a field oxide region on each side of the collector region;
forming a pseudo buried layers under each field oxide region; and
forming a through region under the buried oxide layer.

More Specifically, the method includes the following steps:
forming a buried oxide layer near a bottom of a substrate;
forming two trenches in the substrate by etch;
forming a pseudo buried layer under each of the trenches and performing an annealing process to the pseudo buried layers;
filling a field oxide into the trenches to form field oxide regions;
forming a through region under the buried oxide layer; and
forming a collector region above the buried oxide layer and between the pseudo buried layers.

In specific embodiments, the buried oxide layer can be formed by implanting oxygen with a concentration of $1e^{21}$ $cm^{-3}$ to $1e^{22}$ $cm^{-3}$ into the substrate.

In more specific embodiments, the buried oxide layer can have a thickness of 100 Å to 1000Å.

In more specific embodiments, the pseudo buried layers can be formed by implanting arsenic ions or phosphorus ions at a dose of $1e^{14}$ $cm^{-2}$ to $1e^{16}$ $cm^{-2}$ with an energy of 2 KeV to 50 KeV.

In more specific embodiments, the collector region and the through region can be formed by a single ion implantation process. Moreover, arsenic ions or phosphorus ions can be implanted in the ion implantation process with an energy of 100 KeV to 350 KeV.

As indicated above, a buried oxide layer is formed in the SiGe HBT device according to the present invention, wherein the buried oxide layer is formed by first implanting a proper concentration ($1e^{21}$ cm$^{-3}$ to $1e^{22}$ cm$^{-3}$) of oxygen into a bottom portion of the substrate to form an oxygen-rich region therein, and then performing an annealing process at a high temperature to form the buried oxide layer in the oxygen-rich region with high concentrations. The buried oxide layer can isolate noise from the bottom portion of the substrate and hence can advance noise isolation performance of the SiGe HBT device.

BRIEF DESCRIPTION OF THE DRAWINGS

To further describe the present invention, reference is made to the following detailed description on example embodiments, taken in conjunction with the accompanying drawings, in which.

DETAILED DESCRIPTION

Figure 1:
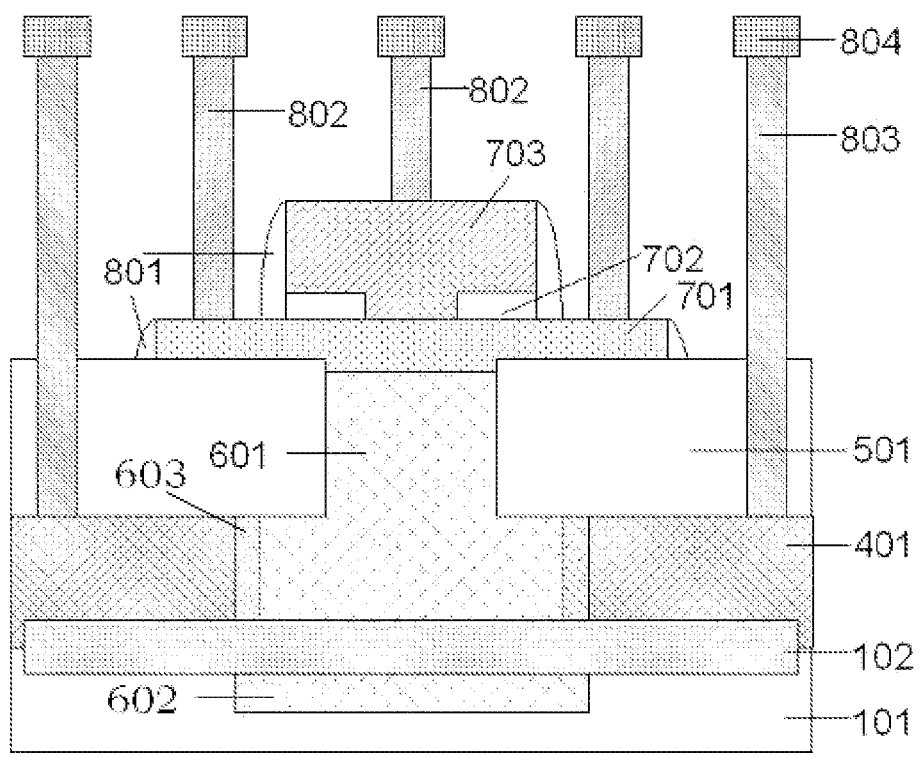
FIG. 1 schematically illustrates a SiGe HBT device according to an embodiment of the present invention.

FIG. 1 schematically illustrates a SiGe HBT device according to an embodiment of the present invention. In this embodiment, the SiGe HBT device includes: a P-type substrate 101; a collector region 601; a pseudo buried layer 401 formed on each side of the collector region 601; a field oxide region 501 formed on each side of the collector region 601; a SiGe epitaxial layer 701 over the collector region 601 and the field oxide regions 501; isolation oxide layers 702 and a polysilicon layer 703, both formed on the SiGe epitaxial layer 701, each of the isolation oxide layers 702 formed on a corresponding side of the polysilicon layer 703 and covered by a corresponding portion of the polysilicon layer 703; and isolation sidewalls 801, each on an opposing side of the SiGe epitaxial layer 701 or on an opposing side of a body composed of the isolation oxide layers 702 and the polysilicon layer 703. The pseudo buried layers 401 are picked up by respective deep contact holes 803 and are connected to metal wires 804, whilst the SiGe epitaxial layer 701 and the polysilicon layer 703 are picked up by respective contact holes 802 and are connected to metal wires 804. In this embodiment, the SiGe HBT device further includes: a buried oxide layer 102 formed in a bottom portion of the P-type substrate 101, the buried oxide layer 102 being formed under the collector region 601 and in contact with the collector region 601; a through region 602 under the buried oxide layer 102; overlapping regions 603, each being formed by the collector region 601 and a corresponding one of the pseudo buried layers 401. The buried oxide layer 201 has a width that is greater than a width of the collector region 601 and smaller than the sum of the width of the collector region 601 and widths of the pseudo buried layers 401. The buried oxide layer 102 may have a thickness of 100 Å to 1000 Å. Moreover, both the collector region 601 and the pseudo buried layers 401 may contain arsenic or phosphorus as dopant.

Figure 2:
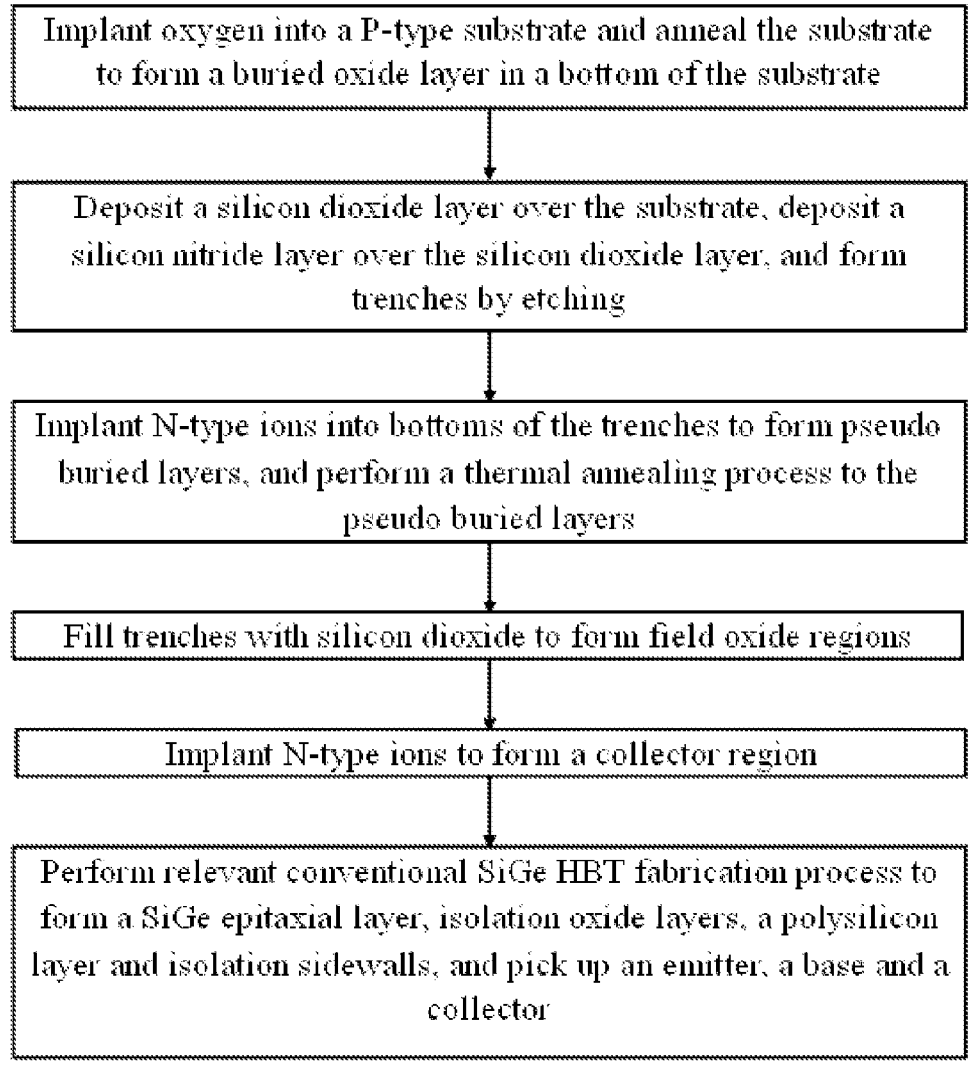
FIG. 2 is a flowchart of a method for manufacturing a SiGe HBT device according to an embodiment of the present invention.

As shown in FIG. 2, a method for manufacturing a SiGe HBT device according to an embodiment of the present invention includes the steps described below.

Figure 3:
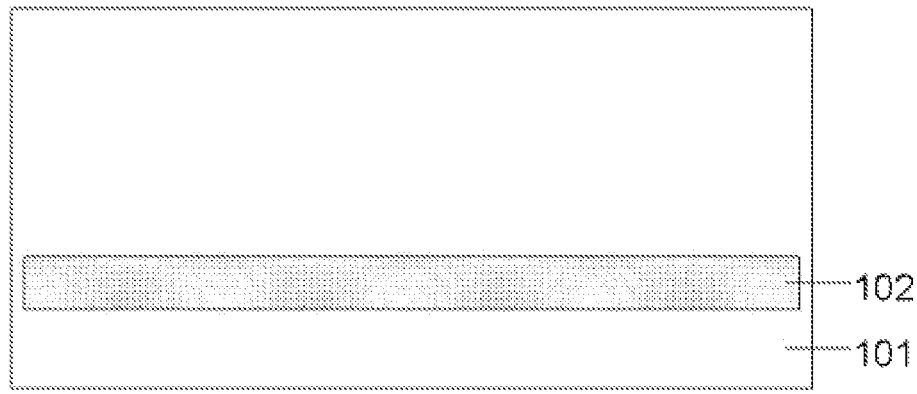
FIG. 3 is a schematic diagram depicting a device structure after a first step of the method for manufacturing a SiGe HBT device in accordance with an embodiment of the present invention is performed.

In a first step, as shown in FIG. 3, a buried oxide layer 102 with a thickness of 100 Å to 1000 Å is formed in a bottom portion of a P-type substrate 101 by implanting oxygen with a concentration of $1e^{21}$ cm$^{-3}$ to $1e^{22}$ cm$^{-3}$ into the P-type substrate 101, followed by an annealing process performed at a high temperature.

Figure 4:
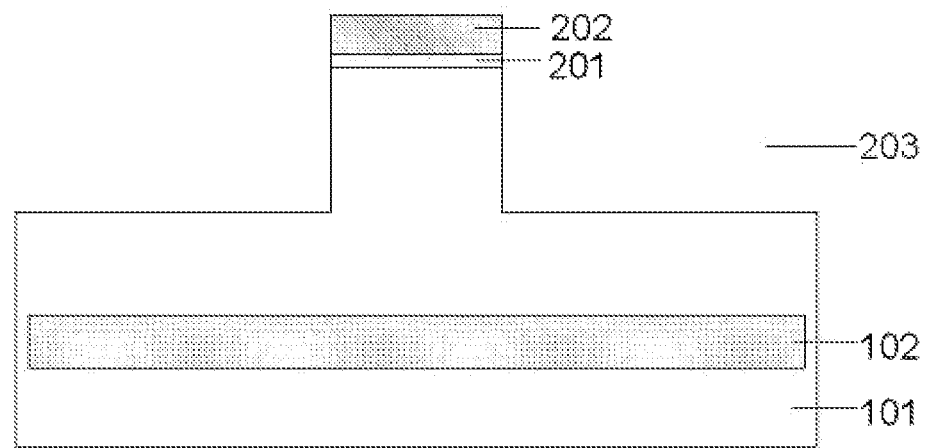
FIG. 4 is a schematic diagram depicting a device structure after a second step of the method is performed.

In a second step, as shown in FIG. 4, a silicon dioxide layer 201 is deposited over the substrate and thereafter a silicon nitride layer 202 is further deposited over the silicon dioxide layer 201. After that, trenches 203 are formed by etching.

Figure 5:
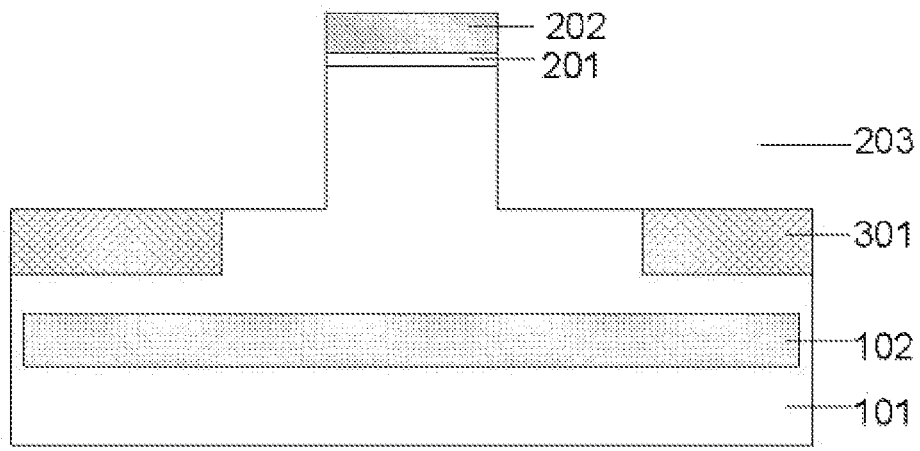
FIG. 5 is a schematic diagram depicting a device structure before an annealing process is performed in a third step of the method.
Figure 6:
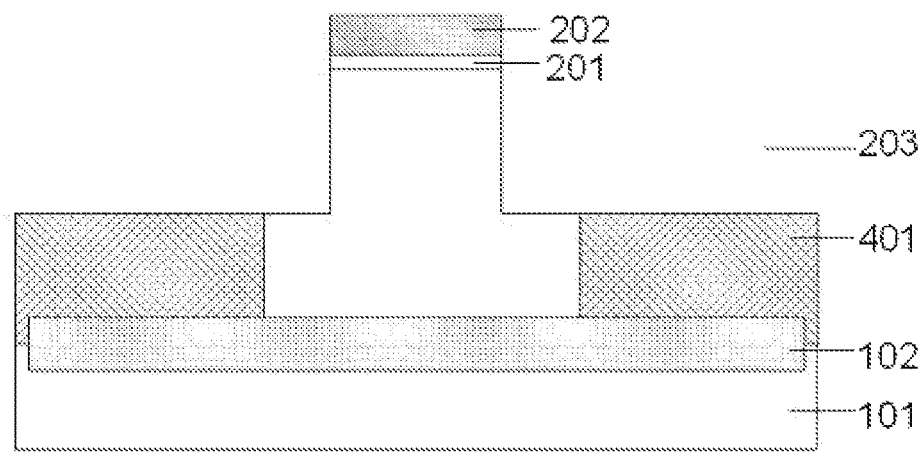
FIG. 6 is a schematic diagram depicting a device structure after the annealing process has been performed in the third step of the method.

In a third step, as shown in FIG. 5 and FIG. 6, arsenic ions or phosphorus ions are implanted into bottoms of the trenches 203 at a dose of $1e^{14}$ cm$^{-2}$ to $1e^{16}$ cm$^{-2}$ with an energy of 2 KeV to 50 KeV to form ion implanted regions 301. Next, the ion implanted regions 301 are treated by a thermal annealing process to form pseudo buried layers 401, each of which covers part of a top surface of the buried oxide layer 102 and part of a side surface of the buried oxide layer 102. In more specific embodiments, the pseudo buried layers 401 may not contact with the buried oxide layer 102, but the horizontal edge of each pseudo buried layer 401 shall exceed the horizontal edge of the buried oxide layer 102. In other words, a width of the buried oxide layer needs to be smaller than the sum of a width of the collector region and widths of the pseudo buried layers.

Figure 7:
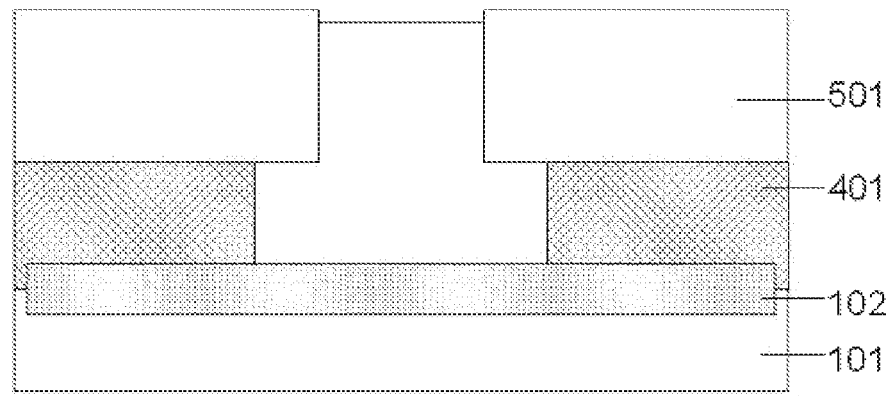
FIG. 7 is a schematic diagram depicting a device structure after a fourth step of the method is performed.

In a fourth step, as shown in FIG. 7, field oxide regions 501 are formed after the silicon dioxide layer 201 and the silicon nitride layer 202 are removed and the trenches 203 are filled with silicon dioxide.

Figure 8:
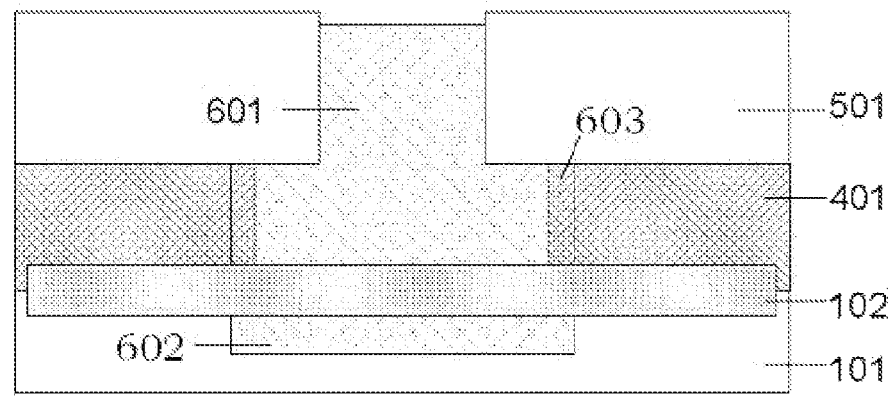
FIG. 8 is a schematic diagram depicting a device structure after a fifth step of the method is performed.
Figure 9:
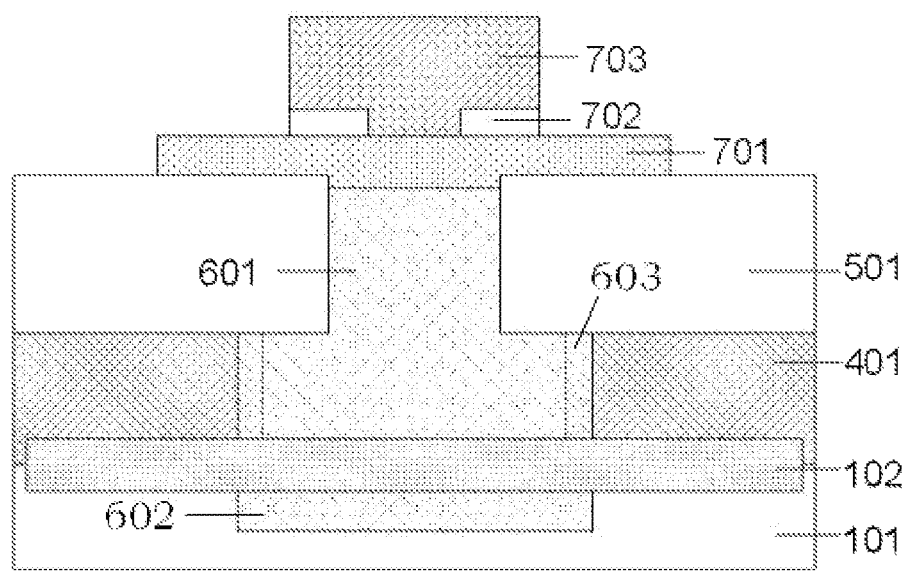
FIG. 9 is a schematic diagram depicting a device structure after a sixth step of the method is performed.

In a fifth step, as shown in FIG. 8, a collector region 601 is formed by implanting a dopant of arsenic or phosphorus into the portion of the substrate between the field oxide regions 501 with an energy of 100 KeV to 350 KeV. During this process, as the implantation generally proceeds very deep into the substrate, concurrently with the formation of the collector region 601, overlapping regions 603 are formed in regions where the collector region 601 is in contact with the pseudo buried layers 401 on both of its sides, moreover, a through region 602 is formed beneath the buried oxide layer 102 (i.e., the through region 602 is a region doped with N-type ions that passes through the buried oxide layer 102 and enters a lower region).

In a sixth step, relevant conventional SiGe HBT fabrication processes are performed to form a SiGe epitaxial layer 701, isolation oxide layers 702, a polysilicon layer 703 and isolation sidewalls 801. After that, the polysilicon layer 703 is picked up by a contact hole 802 and connected to a metal wire 804 so as to serve as an emitter 901. Additionally, the SiGe epitaxial layer 701 is picked up by corresponding contact holes and connected to metal wires 804 so as to serve as a base 902. Moreover, the pseudo buried layers 401 are picked up by deep contact holes and connected to metal wires so as to serve as a collector 903. The resulting SiGe HBT device is shown in FIG. 1.

While specific embodiments have been presented in the foregoing description of the invention, they are not intended to limit the invention in any way. Those skilled in the art can make various modifications and variations without departing from the spirit or scope of the invention. Thus, it is intended that the present invention covers all such modifications and variations.

What is claimed is:

1. A silicon-germanium (SiGe) heterojunction bipolar transistor (HBT) device, comprising:
   a substrate;
   a buried oxide layer formed near a bottom of the substrate;
   a collector region formed in the substrate, the collector region being located above and in contact with the buried oxide layer;
   a field oxide region formed on each side of the collector region;
   a pseudo buried layer formed under each field oxide region and in contact with the collector region; and
   a through region located under and in contact with the buried oxide layer, wherein the buried oxide layer has a width that is greater than a width of the collector region and smaller than a sum of the width of the collector region and widths of the pseudo buried layers.

2. The SiGe HBT device according to claim 1, wherein the through region has a width that is substantially equal to the width of the collector region.

3. The SiGe HBT device according to claim 1, wherein each pseudo buried layer is overlapped with part of the collector region.

4. The SiGe HBT device according to claim 1, wherein the buried oxide layer has a thickness of 100Å to 1000Å.

5. The SiGe HBT device according to claim 1, wherein the collector region contains a dopant of arsenic or phosphorus.

6. The SiGe HBT device according to claim 1, wherein the pseudo buried layers contain a dopant of arsenic or phosphorus.

7. The SiGe HBT device according to claim 1, wherein the through region contains a dopant of arsenic or phosphorus.

8. The SiGe HBT device according to claim 1, wherein the substrate is a P-type substrate.

9. The SiGe HBT device according to claim 1, further comprising:
   A SiGe epitaxial layer formed above the collector region and the field oxide regions;
   isolation oxide layers and a polysilicon layer, both formed on the SiGe epitaxial layer;
   a first isolation sidewall, formed on each side of the SiGe epitaxial layer;
   a second isolation sidewall, formed on each side of a body composed of the isolation oxide layers and the polysilicon layer;
   a deep-hole contact, formed in each field oxide region and in contact with a top of the corresponding pseudo buried layer for picking up a collector;
   a first contact-hole electrode connected to the SiGe epitaxial layer for picking up a base; and
   a second contact-hole electrode formed on the polysilicon layer for picking up an emitter.

* * * * *